United States Patent
Kito et al.

(10) Patent No.: US 6,933,159 B2
(45) Date of Patent: Aug. 23, 2005

(54) FABRICATION METHOD OF A SEMICONDUCTOR LASER DEVICE

(75) Inventors: Masahiro Kito, Osaka (JP); Masato Ishino, Osaka (JP); Tomoaki Toda, Miyagi (JP); Yoshiaki Nakano, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/628,550

(22) Filed: Jul. 28, 2003

(65) Prior Publication Data

US 2004/0022290 A1 Feb. 5, 2004

Related U.S. Application Data

(62) Division of application No. 09/521,512, filed on Mar. 8, 2000, now Pat. No. 6,625,189.

(30) Foreign Application Priority Data

Mar. 8, 1999 (JP) ............................................ 11-059790

(51) Int. Cl.[7] ................................................ H01L 21/66
(52) U.S. Cl. ....................... 438/22; 438/424; 438/425; 438/426; 438/427
(58) Field of Search ....................... 438/22, 48, 40–47, 438/424–426

(56) References Cited

U.S. PATENT DOCUMENTS 5,114,877 A 5/1992 Paoli et al.
5,276,702 A 1/1994 Meliga

FOREIGN PATENT DOCUMENTS

| EP | 0494766 A2 | 7/1992 |
|----|------------|--------|
| EP | 0513745 A2 | 11/1992 |
| EP | 0 706 243 A2 | 4/1996 |
| JP | 1106489 | 4/1989 |
| JP | 03025990 | 2/1991 |
| JP | 10022564 | 1/1998 |
| JP | 2763090 B2 | 3/1998 |

OTHER PUBLICATIONS

European Search Report dated Oct. 10, 2001, application no. EP00104472.

M. Asada et al., "Gain and the Threshold of Three–Dimensional Quantum–Box Lasers", IEEE Journal of Quantum Electronics, vol. OE–22, No. 9, pp. 1915–1921, Sep. 1986.

S. Aral et al. "GaInAsP/InP Long–Wavelength Quantum––Wire Semiconductor Lasers", Proceedings of the 1997 Electronics Society Conference of Institute of Electronics, Information and Communication Engineers, pp. 266–267, Aug. 13, 1997 (partial translation).

*Primary Examiner*—Dung A. Le
(74) *Attorney, Agent, or Firm*—RatnerPrestia

(57) ABSTRACT

In a method for fabricating a semiconductor laser device, a plurality of grooves are formed in a surface of one conductive type of an InP layer. The InP layer is thermally treated in an atmosphere including at least a gas containing phosphorus and a gas containing arsenic in a mixed state, thereby forming a plurality of active regions made of InAsP in the plurality of grooves. An other conductive type of semiconductor layer is formed after the active regions are formed.

10 Claims, 7 Drawing Sheets

(a)

(b)

(c)

FABRICATION METHOD OF A SEMICONDUCTOR LASER DEVICE

This application is a Div of Ser. No. 09/521,512 Mar. 8, 2000 U.S. Pat. No. 6,625,189.

BACKGROUND OF THE INVENTION

1. Field of the Invention

The present invention relates to a semiconductor laser device suitable for use as a light source which is used for long distance, large optical communication. The present invention further relates to a method for fabricating such a semiconductor laser device.

2. Description of the Related Art

In order to realize a semiconductor laser having an improved rapid response property, which is used for long distance, large data transmission, it has been attempted to apply a quantum wire structure to an active layer of a semiconductor laser. The quantum wire structure has a high gain property relative to a quantum thin film structure. In addition, it is theoretically presumed that the semiconductor laser having the quantum wire structure operates with a small current, with high efficiency, and with narrow spectral linewidth (M. Asada et al., IEEE JQE, vol. QE-22, No. 9, pp. 1915–1921, 1986).

FIG. 6 shows a conventional semiconductor laser device 600 having a quantum wire structure (Arai et al., Proceedings of Electronics Society Conference of Institute of Electronics, Information and Communication Engineers, 1997, pp. 266–267). As shown, double-quantum well active regions 602 each having a trapezoid shape are formed above an InP substrate 601, and the width of the trapezoid is about 35 nm in the center portion thereof. The well regions 602 each have a thickness of 10 nm, and form a quantum wire structure.

A method for fabricating the conventional semiconductor laser device 600 having a quantum wire structure is described with reference to parts (a) to (c) of FIG. 7. As shown in part (a) of FIG. 7, in the first crystal growth process, an InGaAsP light confinement layer 603, a quantum well active layer 604 having two wells, and an InGaAsP protective layer 605 are serially formed on a p-type InP substrate 601. Thereafter, as shown in part (b) of FIG. 7, predetermined portions of the quantum well active layer 604 are selectively etched, thereby forming a plurality of double-quantum well active regions 602 each having a trapezoid shape in a periodic pattern. Thereafter, as shown in part (c) of FIG. 7, an undoped InP layer 606, InGaAsP light confinement layer 607, and an n-type InP cladding layer 608 are grown through a crystal growth process, thereby confining the double-quantum well active regions 602 each having a trapezoid shape.

However, in this fabrication method, it is necessary to once etch the quantum well active layer 604 so that the quantum well active layer 604 has a quantum wire structure, and faces exposed by etching are exposed to a thermal treatment during a subsequent regrowth process. Such a thermal treatment may introduce a defect by etching a portion of the quantum well active regions 602, and the defect may deteriorate an optical property of the quantum well active regions 602. Furthermore, the long-term reliability of the semiconductor laser device may decrease.

Furthermore, the size of the quantum wire structure having a trapezoid shape, which is formed by etching, varies according to even a small variation of the concentration of an etching solution. Thus, it is difficult to fabricate a quantum wire structure having a uniform size.

SUMMARY OF THE INVENTION

According to one aspect of the present invention, a semiconductor laser device includes an InP substrate and a multi-layered structure formed on the InP substrate, wherein the multi-layered structure includes at least a plurality of active regions for outputting a laser beam, and the plurality of active regions each are provided in each of a plurality of grooves dented toward the InP substrate.

According to one embodiment of the present invention, the cross-sectional shape of each of the plurality of grooves is a triangle dented toward the InP substrate.

According to one embodiment of the present invention, the plurality of active regions is made of InAsP.

According to another embodiment of the present invention, the active regions are formed in a periodic pattern in a direction parallel to the resonator length direction.

According to still another embodiment of the present invention, the semiconductor laser device further includes: an InP layer: and a light confinement layer made of a semiconductor having a bandgap energy between the bandgap energy of a semiconductor constituting the active regions and the bandgap energy of InP, wherein the active regions are provided between the light confinement layer and the InP layer.

According to still another embodiment of the present invention, the semiconductor laser device further includes a light confinement layer made of a semiconductor having a bandgap energy between the bandgap energy of a semiconductor constituting the active regions and the bandgap energy of InP, wherein the active regions are surrounded by the light confinement layer.

According to still another embodiment of the present invention, the light confinement layer is made of InGaAsP.

According to still another embodiment of the present invention, the active regions each has a multiquantum well structure.

According to still another embodiment of the present invention, a well layer of the multiquantum well structure is made of InAsP.

According to still another embodiment of the present invention, a barrier layer of the multiquantum well structure is made of InP.

According to still another embodiment of the present invention, the active regions each has a size such that a quantum size effect is obtained.

According to still another embodiment of the present invention, the pitch of the active regions is a multiple of $(1/(2\times n_{eff}))$ by a factor of any integer, where $n_{eff}$ is the effective refractive index of the multi-layered structure with respect to an oscillation wavelength.

According to another aspect of the present invention, a method for fabricating a semiconductor laser device includes steps of: forming a plurality of grooves in a surface of an InP layer; and thermally treating the InP layer in an atmosphere including at least a gas containing phosphorus and a gas containing arsenic in a mixed state, thereby forming a plurality of active regions made of InAsP in the plurality of grooves.

According to one embodiment of the present invention, each of the grooves is formed in a triangle shape such that a bottom of the triangle is on a surface of the InP layer.

According to another embodiment of the present invention, wherein the InP layer is an uppermost layer of a multi-layered structure.

According to still another embodiment of the present invention, the method for fabricating a semiconductor laser device further includes a step of forming a light confinement layer adjacent to the InP layer, wherein the light confinement layer made of a semiconductor having a bandgap energy between the bandgap energy of a semiconductor constituting the active regions between the InP substrate and the InP layer and the bandgap energy of InP.

According to still another embodiment of the present invention, the step of thermally treating the InP layer includes a step of intermittently providing a gas containing arsenic, thereby forming a plurality of active regions each having a well layer made of InAsP in the plurality of grooves.

According to still another embodiment of the present invention, the semiconductor laser device includes a step of forming a light confinement layer adjacent to the InP layer, wherein the light confinement layer made of a semiconductor having a bandgap energy between the bandgap energy of a semiconductor constituting the active regions between the InP substrate and the InP layer and the bandgap energy of InP.

According to still another embodiment of the present invention, the light confinement layer is made of InGaAsP.

According to still another embodiment of the present invention, the plurality of grooves have a periodic pattern in a direction parallel to a resonator length direction.

Thus, the invention described herein makes possible the advantages of (1) providing a semiconductor laser device having a quick response property and a long-term reliability, and a fabrication method of such a semiconductor laser device; (2) providing a semiconductor laser device having active regions as small as several tens of nanometers which are arranged at a high density, and thus functioning as a quantum wire laser; and (3) providing a distributed feedback type semiconductor laser including periodically formed active regions that function as a diffraction grating, and thus being capable of oscillating with a single wavelength, providing a low noise property, enabling a long distance optical transmission, etc.

These and other advantages of the present invention will become apparent to those skilled in the art upon reading and understanding the following detailed description with reference to the accompanying figures.

DESCRIPTION OF THE PREFERRED EMBODIMENTS

Figure 1A:
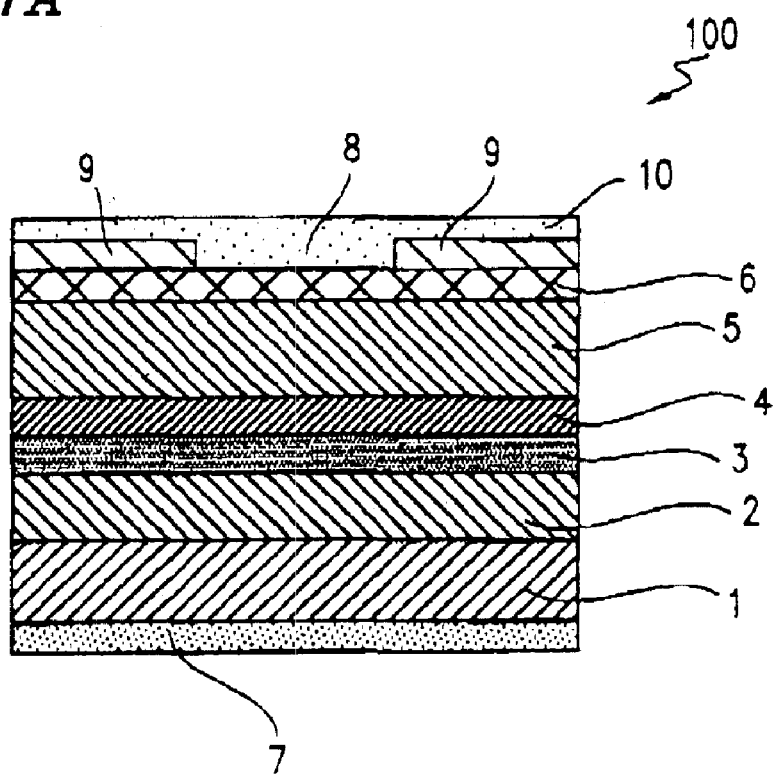
FIGS. 1A and 1B are cross-sectional views of a semiconductor laser device according to one embodiment of the present invention.
Figure 1B:
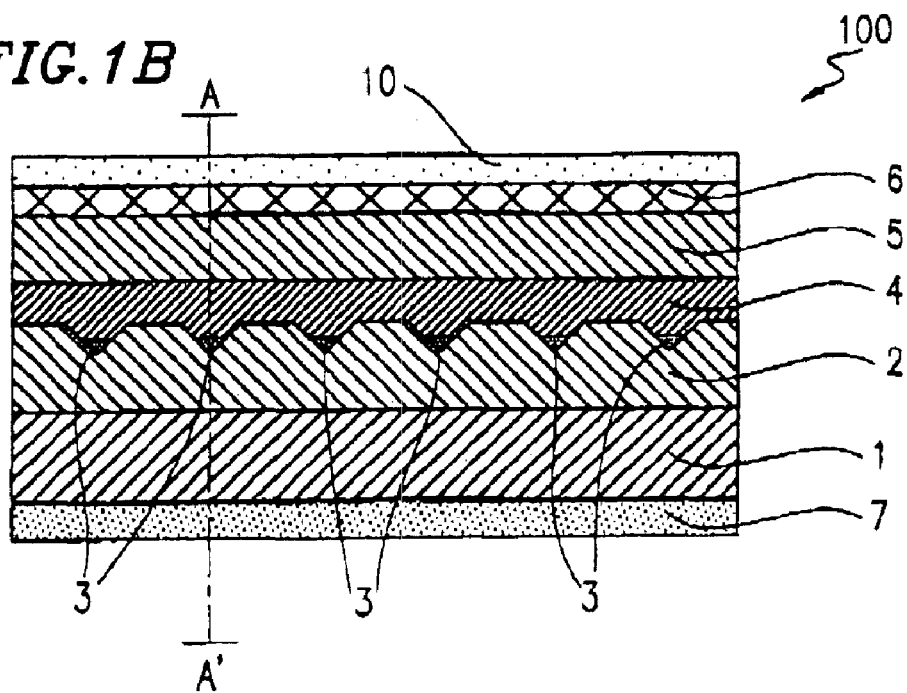
Figure 3:
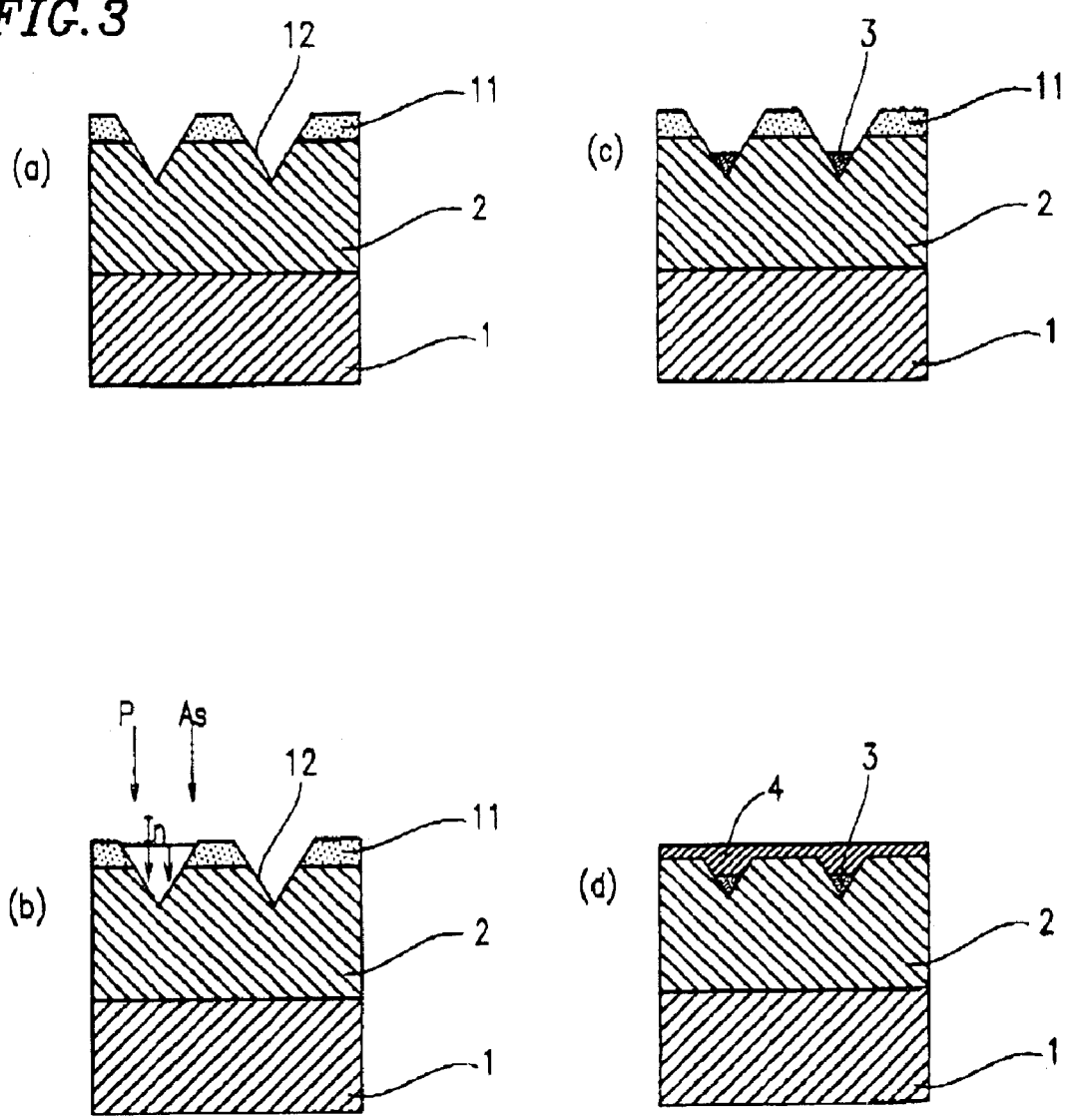
FIG. 3 shows cross-sectional views for illustrating principal steps of the fabrication process of the semiconductor laser device according to the present invention.
Figure 4:
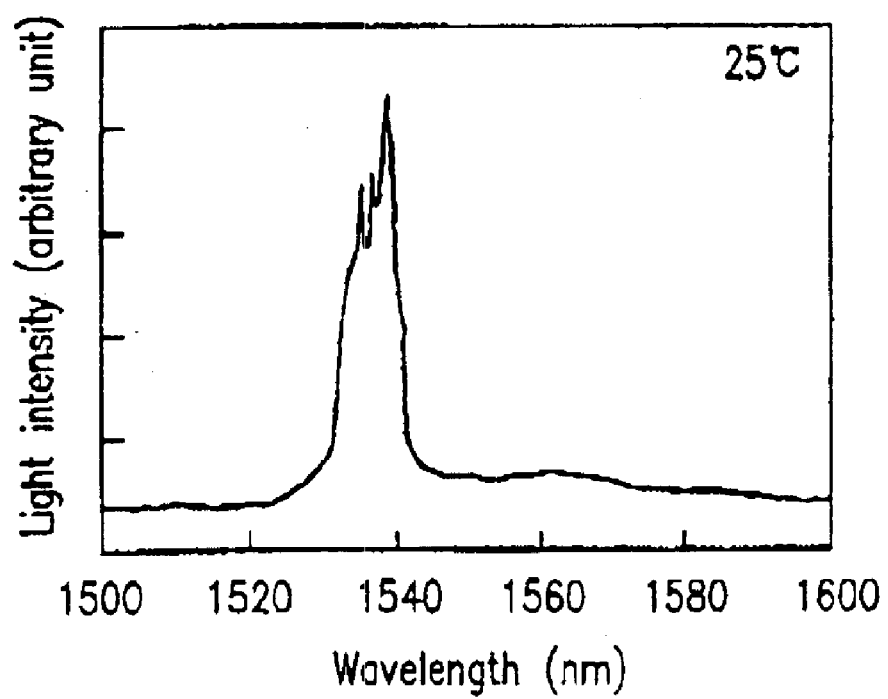
FIG. 4 is a graph showing an oscillation spectral characteristic of the semiconductor laser device according to the present invention.

FIG. 1A is a cross-sectional view of a semiconductor laser device 100 according to one embodiment of the present invention showing a facet perpendicular to a resonator length direction. FIG. 1B is a cross-sectional view showing a facet of the semiconductor laser device 100 parallel to the resonator length direction. FIG. 1A is a cross-sectional view of the semiconductor laser device 100 taken along line A—A' of FIG. 1B. Parts (a) to (e) of FIG. 2 and parts (a) to (d) of FIG. 3 are cross-sectional views showing a fabrication method of the semiconductor laser device 100 according to the present invention. Parts (a) to (e) of FIG. 2 and parts (a) to (d) of FIG. 3 each show a facet of the semiconductor laser device 100 parallel to the resonator length direction. FIG. 4 is a graph showing a characteristic of the semiconductor laser device 100 according to the present invention.

The semiconductor laser device 100 includes, on an n-type InP substrate 1 having a (001) surface, an undoped InGaAsP light confinement layer 2 (thickness: 150 nm, $\lambda g=1.25\,\mu m$), InAsP active regions 3, an undoped InP buffer layer 4 (thickness: 100 nm), a p-type InP cladding layer 5 (thickness: 1 $\mu m$), and a p-type InGaAs contact layer 6 (thickness: 200 nm). The semiconductor laser device 100 has a broad area structure having a stripe width of 100 $\mu m$. The resonator length is 750 $\mu m$.

An n-side electrode 7 made of Ti/Au is formed on the back surface of the n-type InP substrate 1. An $SiO_2$ insulating film 9 including a stripe-shaped window 8 (width: 100 $\mu m$) is formed on the p-type InGaAs contact layer 6. A p-side electrode made of Ti/Au is formed on the $SiO_2$ insulating film 9 so as to be in contact with the p-type InGaAs contact layer 6 through the stripe-shaped window 8.

The plurality of InAsP active regions 3 are formed at a pitch of 238 nm in the resonator length direction between the undoped InGaAsP light confinement layer 2 and the undoped InP buffer layer 4. As shown in FIG. 1B, the shape of the InAsP active regions 3, seen on a facet parallel to the resonator length direction and perpendicular to the top face of the n-type InP substrate 1, is triangular. Each side of the triangle is about 25 nm, and one apex extends toward the n-type InP substrate 1. When the InAsP active region 3 having such a structure is formed, it is not necessary to etch the active region 3. Details of the active region 3 will be described later with reference to FIG. 2. In general, it is significantly difficult to form by conventional etching an active region as small as several tens of nanometers, as provided in the structure of the present invention, and the size of the active region 3 therefore may vary widely. In the semiconductor laser device 100 according to the present invention, it is possible to uniformly form small active regions having a size of about several tens of nanometers because it is not necessary to etch the active regions. With such small active regions, the sought effects of quantum wire can be realized.

In the present embodiment, the photoluminescence wavelength of the InAsP active regions 3 formed periodically in the resonator length direction is set to about 1.55 $\mu m$. On the other hand, the Bragg wavelength that is determined by the pitch of the InAsP active regions 3 is 1.53 μm, obtaining a laser oscillation having a single wavelength at the Bragg wavelength.

Furthermore, in the semiconductor laser device 100 shown in FIG. 1B, the undoped InGaAsP light confinement layer 2 and the pitch of the InAsP active regions 3 are alternately provided in a resonator length direction in an interface area therebetween. In such a structure, the refractive index difference is small relative to that in a structure in which the undoped InP buffer layer 4 and the InAsP active regions 3 are provided alternately in the resonator length direction. As a result, the ratio of a gain coupling becomes larger than that of a refractive index coupling, thereby increasing the probability of the oscillation with a single wavelength.

A fabrication method of the semiconductor laser device 100 shown in FIGS. 1A and 1B is described with reference to FIG. 2.

Figure 2:
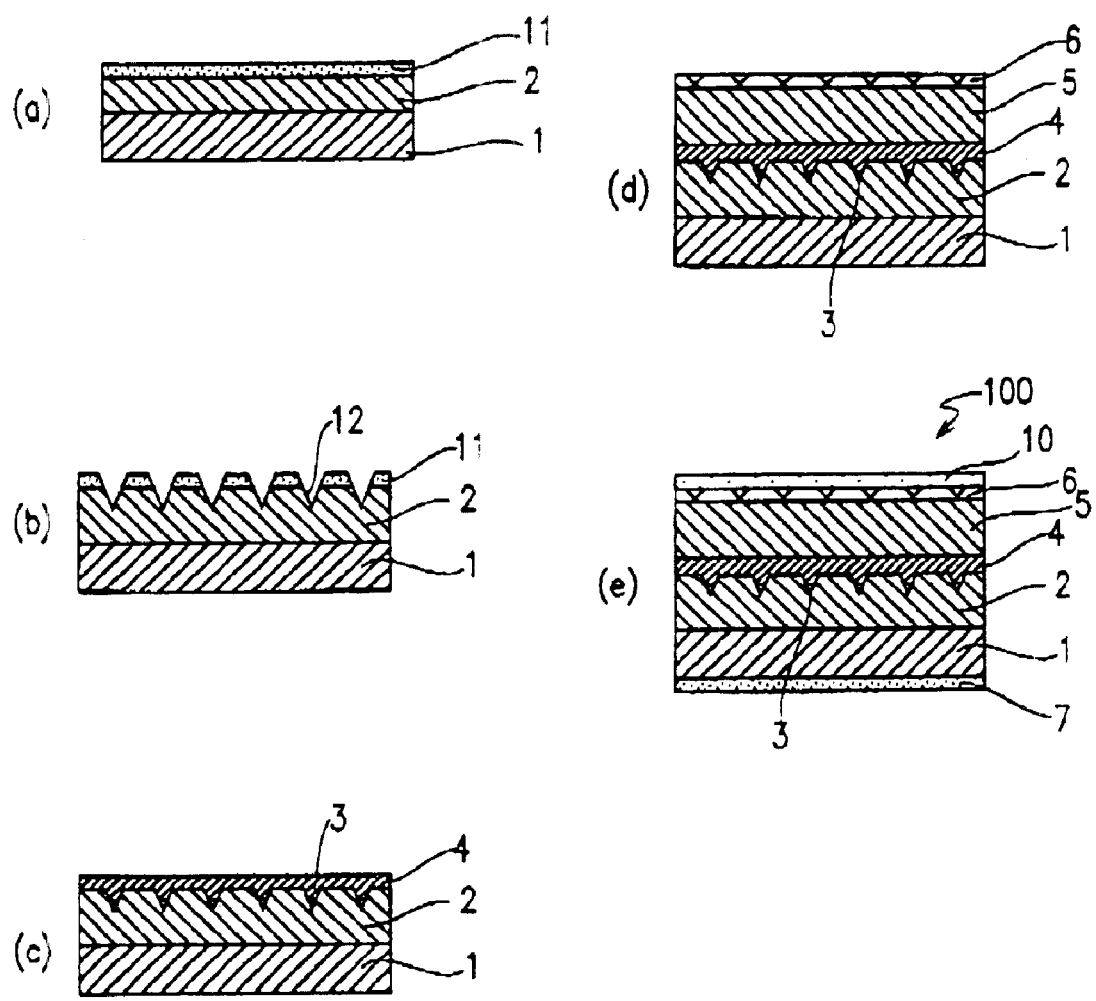
FIG. 2 shows cross-sectional views for illustrating a fabrication process of the semiconductor laser device shown in FIG. 1B.

As shown in part (a) of FIG. 2, the undoped InGaAsP light confinement layer 2 (thickness: 150 nm) and an InP provisional layer 11 are formed on the n-type InP substrate 1 by the metal organic vapor phase growing method.

Next, as shown in part (b) of FIG. 2, a diffraction grating 12 (pitch 238 nm, depth 200 nm) in the form of grooves dented toward the InP substrate 1, having a stripe-shape in a <1-10> direction, is formed by etching and by a two luminous flux interference exposure method so that the etched groove is formed in the undoped InGaAsP light confinement layer 2.

Next, tert-butyl phosphine and tert-butyl arsine are introduced into a hydrogen atmosphere, and the n-type InP substrate 1 is heated to 550° C. in the resultant atmosphere. As a result, the InAsP active regions 3 are formed in concave portions of the diffraction grating 12 so as to have a thickness of about 10 nm as shown in part (c) of FIG. 2. Furthermore, the provision of tert-butyl arsine is stopped while the thermal treatment continues, whereby an undoped InP buffer layer 4 (thickness: 150 nm) is formed on the InAsP active regions 3 so that the undoped InP buffer layer 4 has a flat top surface. Thereafter, as shown in part (d) of FIG. 2, a p-type InP cladding layer 5 (thickness: 1 μm), and a p-type InGaAs contact layer 6 (thickness: 200 nm) are sequentially formed on the undoped InP buffer layer 4 by the metal organic vapor phase growing method.

Thereafter, as shown in part (e) of FIG. 2, an $SiO_2$ insulating film is formed on the p-type InGaAs contact layer 6, and a stripe-shaped window (width: 100 μm) is formed in the $SiO_2$ insulating film. Then, a p-side electrode 10 made of Ti/Au is formed on the $SiO_2$ insulating film. Furthermore, a n-side electrode 7 made of Ti/Au is formed on the back face of the n-type InP substrate 1. After the cleavage process, a semiconductor laser device 100 is completed.

In the present embodiment, the active regions 3 are not etched. Thus, atoms rarely leak out from the surface of the active regions 3 even when the temperature becomes high during the time when the semiconductor film is grown after the etching.

Furthermore, after the diffraction grating 12 has been fabricated, only the growth of a semiconductor layer is required to complete the most important part of the laser device. Therefore, it is easy to fabricate the semiconductor laser device of the present invention.

Important steps in the above-described fabrication method are described in detail with reference to parts (a) to (d) of FIG. 3.

Part (a) of FIG. 3 is a cross-sectional view of a structure including an n-type InP substrate 1, an undoped InGaAsP light confinement layer 2 and an InP provisional layer 11. After the formation of the undoped InGaAsP light confinement layer 2 and the InP provisional layer 11 on the n-type InP substrate 1, a diffraction grating 12 is formed by etching as shown in part (a) of FIG. 3. The resultant structure shown in part (a) of FIG. 3 is thermally treated in an atmosphere containing tert-butyl phosphine and tert-butyl arsine in a mixed state. During the thermal treatment, referring to part (b) of FIG. 3, In leaks from the InP provisional layer 11 due to a mass-transport phenomenon, and tert-butyl arsine and tert-butyl phosphine are degraded to generate As and P, respectively, thereby forming InAsP regions 3 made of In from the InP provisional layer 11, As from tert-butyl arsine, and P from tert-butyl phosphine in concave portions of the diffraction grating 12 as shown in part (c) of FIG. 3. As shown, the InAsP regions 3 are periodically provided, and each of them is formed in an inverted triangle shape. Furthermore, the supply of tert-butyl arsine is stopped while the thermal treatment continues, thereby forming an undoped InP buffer layer 4 of In mass-transported from the remaining InP provisional layer 11 and P from degraded tert-butyl phosphine on the InAsP regions 3 and the undoped InGaAsP light confinement layer 2 so as to have a flat top surface. The flat surface of the undoped InP buffer layer 4 is significant for preventing the degradation of the crystal quality of layers to be formed on the undoped InP buffer layer 4. Furthermore, in view of an effect of a quantum wire, it is preferable that the thickness of the InAsP regions 3 be 50 nm or less.

In the present embodiment, tert-butyl phosphine and tert-butyl arsine are used as a gas containing phosphorus and a gas containing arsenic, respectively. Therefore, it is possible to maintain the degradation efficiency of each of the gases in a temperature range in which the mass-transport occurs during the increase of the temperature. Accordingly, it is possible to obtain the uniform composition in the InAsP active regions 3 along a direction of the thickness thereof.

Figure 6:
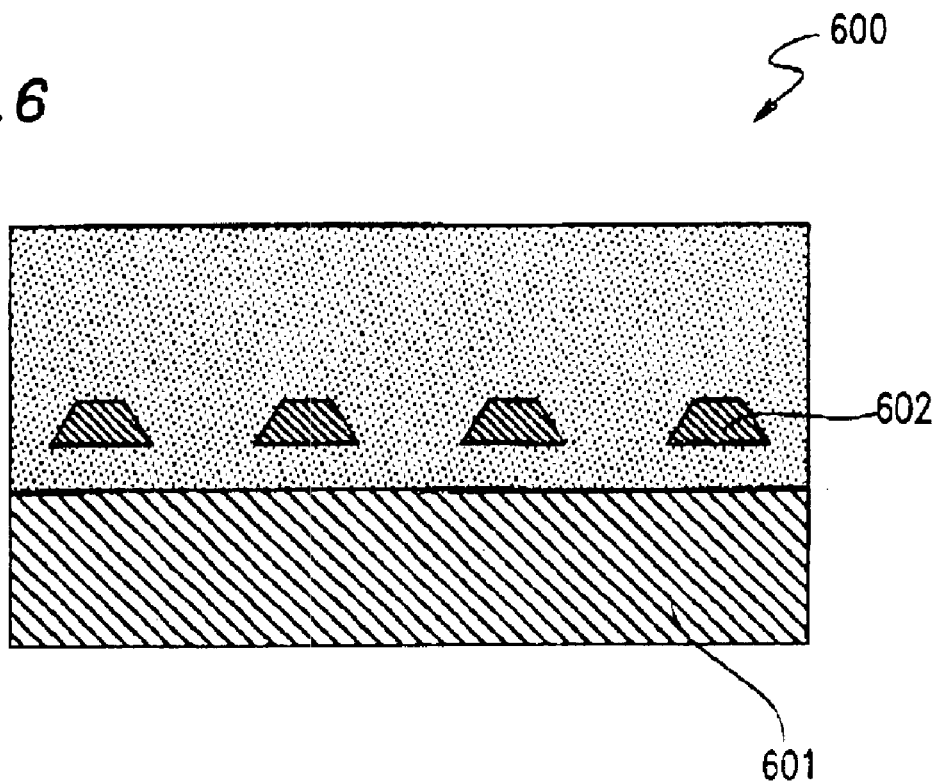
FIG. 6 is a cross-sectional view showing a conventional quantum wire laser.
Figure 7:
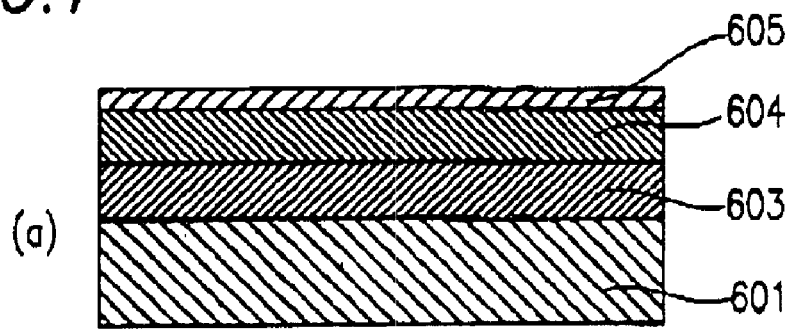
FIG. 7 shows cross-sectional views for illustrating a fabrication process of the conventional quantum wire laser.
Figure 7:
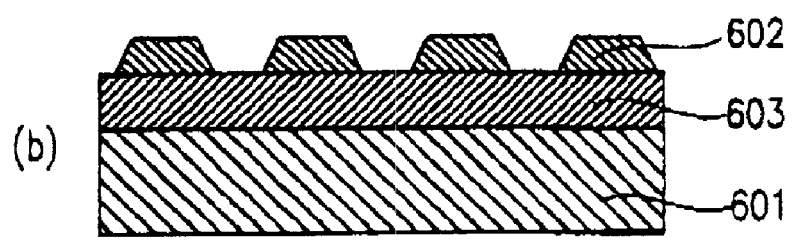
Figure 7:
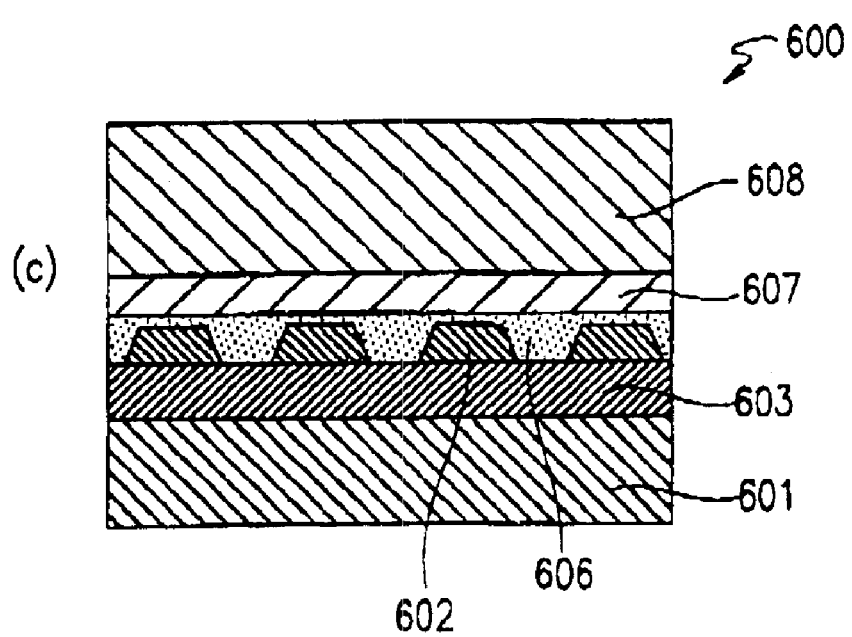

FIG. 4 shows the oscillation spectrum of the semiconductor laser device 100 shown in FIG. 1. The measurement was carried out by supplying a pulse current having a cycle of 1 μs and a duty of 0.01% to the semiconductor laser device 100 at a room temperature. An oscillation in the vicinity of a Bragg wavelength of 1.53 μm was observed, even though the oscillation was a transverse multimode oscillation because the stripe width of the semiconductor laser device 100 is as large as 100 μm. Furthermore, a threshold current density was 0.16 $kA/cM^2$. It is reported that in the conventional semiconductor laser device 600 shown in FIG. 6, a threshold current density was 2.4 $kA/cm^2$. That is, according to the semiconductor laser device 100 of the present invention, the threshold current is significantly reduced.

The present embodiment employs a broad area structure. Alternatively, by employing a buried hetero structure, it is possible to realize a lower threshold current characteristic.

Furthermore, in the present embodiment, tert-butyl phosphine is used as a gas containing phosphorus. However, the same effect can be obtained even with phosphine. In the present embodiment, tert-butyl arsine is used as a gas containing arsenic. However, the same effect can be obtained even with arsine.

Figure 5A:
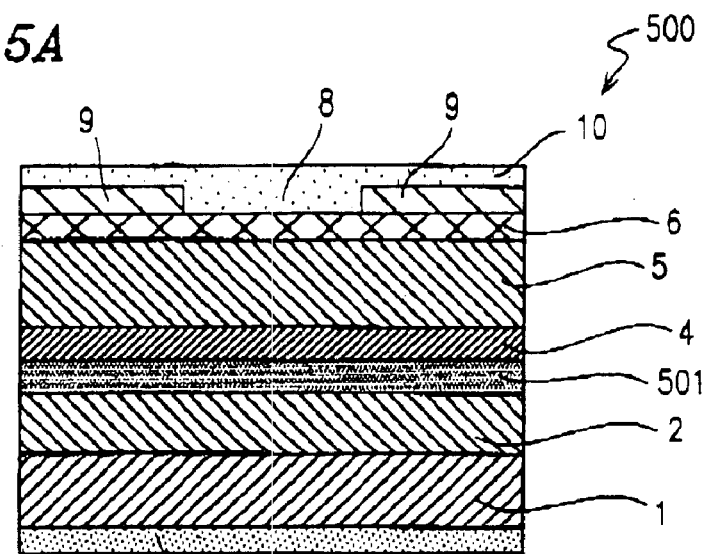
FIGS. 5A and 5B are cross-sectional views of a semiconductor laser device according to another embodiment of the present invention, in which active regions each has a multiquantum well structure.
Figure 5B:
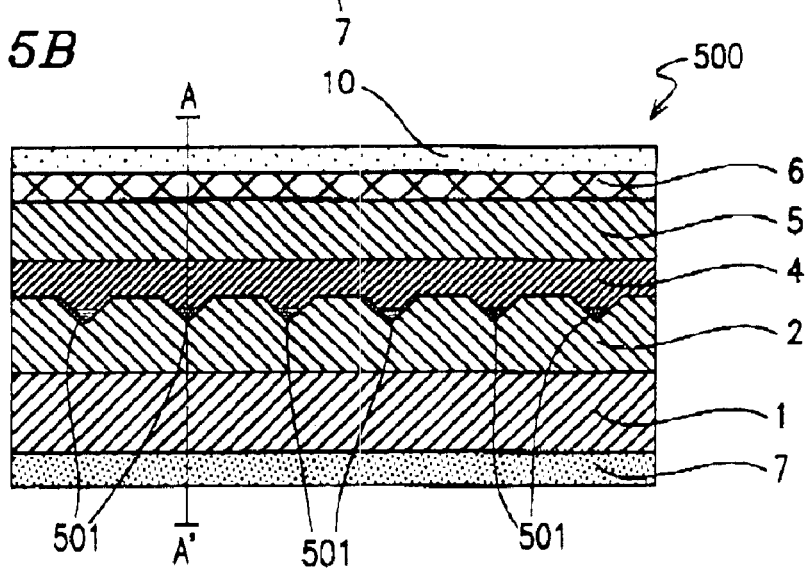
Figure 5C:
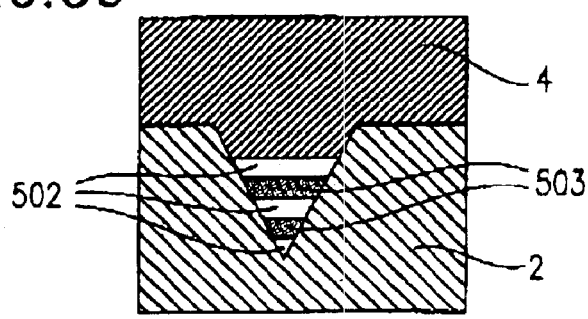
FIG. 5C is an enlarged view of one of the active regions shown in FIG. 5B.

FIG. 5A is a cross-sectional view of a semiconductor laser device 500 according to another embodiment of the present invention showing a facet thereof perpendicular to a resonator length direction. FIG. 5B is a cross-sectional view of the semiconductor laser device 500 showing a facet thereof parallel to the resonator length direction. FIG. 5A is a cross-sectional view of the semiconductor laser device 500 taken along line A–A' of FIG. 5B. FIG. 5C is an enlarged view of active regions 501. The semiconductor laser device 500 has the same structure as that of the semiconductor laser device 100 shown in FIGS. 1A and 1B except for the active regions 501. The active regions 501 of the semiconductor laser device 500 each have a multiquantum well structure including barrier layers 502 and well layers 503 deposited alternately in concave portions of the light confinement layer 2. Preferably, the barrier layers 502 are made of InP, and the well layers 503 are made of InAsP. Furthermore, it is preferable that each of the well layers 503 has a thickness of 10 nm or less so that a quantum size effect is obtained. With such a structure of the semiconductor laser device 500, the differential gain increases, whereby the threshold current decreases, and the rapid response property improves.

A fabrication method of the semiconductor laser device 500 is substantially the same as that of the semiconductor laser device 100 which has been described with reference to FIGS. 2 and 3. However, between these methods, there is a difference in that the active regions 501 of the semiconductor laser device 500 are formed so that the active regions 501 each include the barrier layers 502 and the well layers 503. A well layer 503 is formed of InAsP in a groove by the same method as used for forming the active regions 3 of the semiconductor laser device 100, a barrier layer 502 is formed of InP on the resultant well layer 503 by the same method as used for forming the buffer layer 4 of the semiconductor laser device 100, i.e., by stopping the provision of tert-butyl arsine halfway in the thermal treatment, and these steps may be alternately repeated, thereby forming the multiquantum well structure of the active regions 501.

Furthermore, according to still another embodiment of the present invention, it is preferable that a band gap energy of the light confinement layer is between a band gap energy of InP and a band gap energy of the active regions. Such a desirable band gap energy is described in Japanese Laid-Open Publication No. 3-25990. With such an arrangement, light is prevented from extending into the InP substrate and is concentrated in the well layers, whereby it is possible to increase the gain of the output of the laser device. Furthermore, the undoped InGaAsP light confinement layer 2 and the undoped InP buffer layer 4 may be made of the same material, and the active regions 3 may be sandwiched by the light confinement layer 2 and the buffer layer 4 (i.e., another light confinement layer).

Furthermore, in the above embodiments, each active region is formed in the groove in a triangle shape. However, the shape of the grooves (i.e., the shape of active regions formed in the grooves) is not limited to a triangle as long as grooves are formed so as to have any shape, and the active regions are formed in these grooves.

Furthermore, in the above embodiments, the active regions are formed in a periodic pattern (i.e., the grooves are formed in a periodic pattern in the light confinement layer 2). However, it is apparent to those skilled in the art that the present invention is not limited to such a periodic pattern. If the active regions are formed in a periodic pattern, the pitch of the active regions is a multiple of (1/(2×neff)) by a factor of any integer, where neff is the effective refractive index of the multi-layered structure with respect to an oscillation wavelength. By satisfying this condition, i.e., a primary diffraction condition under which the pitch causes a distributed feedback, the maximum diffraction is obtained.

In a semiconductor laser of the present invention, since the size of semiconductor regions formed in grooves is uniform, an effect of a quantum wire can be easily obtained. When a semiconductor laser device of the present invention is a gain coupled, distributed feedback type semiconductor laser device, the semiconductor laser device produces a quantum wire effect, and there is a high probability that the oscillation occurs with a single wavelength in such a semiconductor laser device. Furthermore, even in the presence of return light from outside of the laser device, the mode of the laser does not change, and the laser device is not susceptible to noise.

According to a fabrication method of a semiconductor laser device of the present invention, active regions are periodically formed without the active regions being subjected to an etching step. Therefore, after the active regions are formed, it is possible to grow semiconductor layers of fine quality. A semiconductor laser device fabricated according to such a fabrication method exhibits high reliability for a long term. Furthermore, since the active regions are formed not by etching but by a vapor phase growing method, the active regions can be formed with considerable control accuracy. The fabrication process is simple and easy, and is a process of great versatility.

When a semiconductor laser device of the present invention is a distributed feedback type semiconductor laser device, the semiconductor laser device produces a quantum wire effect, and a light source can be fabricated with relatively loose restrictions in design of a spectral linewidth at a high production yield. In addition, a light source can be fabricated with relatively loose restrictions in design of a spectral linewidth through a considerably simple process with great applicability. Thus, a semiconductor laser device fabricated according to the present invention has a great practical value.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor laser device comprising steps of:

forming a plurality of grooves in a surface of one conductive type of an InP layer;

thermally treating the InP layer in an atmosphere including at least a gas containing phosphorus and a gas containing arsenic in a mixed state, thereby forming a plurality of active regions made of InAsP in the plurality of grooves; and forming an other conductive type of a semiconductor layer after forming the active regions.

2. A method for fabricating a semiconductor laser device according to claim 1, wherein each of the grooves is formed in a triangle shape such that a bottom of the triangle is on a surface of the InP layer.

3. A method for fabricating a semiconductor laser device according to claim 1, wherein the InP layer is an uppermost layer of a multi-layered structure.

4. A method for fabricating a semiconductor laser device according to claim 3, further comprising a step of forming a light confinement layer adjacent to the InP layer, wherein the light confinement layer made of a semiconductor having a bandgap energy between the bandgap energy of a semiconductor constituting the active regions between the InP substrate and the InP layer and the bandgap energy of InP.

5. A method for fabricating a semiconductor laser device according to claim 4, wherein the light confinement layer is made of InGaAsP.

6. A method for fabricating a semiconductor laser device according to claim 3, wherein the step of thermally treating the InP layer includes a step of intermittently providing a gas containing arsenic, thereby forming a plurality of active regions each having a well layer made of InAsP in the plurality of grooves.

7. A method for fabricating a semiconductor laser device according to claim 6, comprising a step of forming a light confinement layer adjacent to the InP layer, wherein the light confinement layer made of a semiconductor having a bandgap energy between the bandgap energy of a semiconductor constituting the active regions between the InP substrate and the InP layer and the bandgap energy of InP.

8. A method for fabricating a semiconductor laser device according to claim 6, wherein the light confinement layer is made of InGaAsP.

9. A method for fabricating a semiconductor laser device according to claim 1, wherein the step of thermally treating the InP layer includes a step of intermittently providing a gas containing arsenic, thereby forming a plurality of active regions each having a well layer made of InAsP in the plurality of grooves.

10. A method for fabricating a semiconductor laser device according to claim 1, wherein the plurality of grooves have a periodic pattern in a direction parallel to a resonator length direction.

* * * * *